(12) United States Patent
Goebl et al.

(10) Patent No.: US 8,564,126 B2
(45) Date of Patent: Oct. 22, 2013

(54) SEMICONDUCTOR ARRANGEMENT

(75) Inventors: Christian Goebl, Nürnberg (DE); Heiko Braml, Wiesenttal (DE); Ulrich Herrmann, Nürnberg (DE); Tobias Fey, Erlangen (DE)

(73) Assignee: Semikron Elektronik GmbH & Co. KG, Nürnberg (DE)

( * ) Notice: Subject to any disclaimer, the term of this patent is extended or adjusted under 35 U.S.C. 154(b) by 678 days.

(21) Appl. No.: 12/704,289

(22) Filed: Feb. 11, 2010

(65) Prior Publication Data

US 2010/0264537 A1   Oct. 21, 2010

(30) Foreign Application Priority Data

Feb. 16, 2009 (DE) .......................... 10 2009 000 888

(51) Int. Cl.
*H01L 29/72* (2006.01)
(52) U.S. Cl.
USPC ................ 257/734; 257/E23.01; 174/258
(58) Field of Classification Search
USPC .................... 257/734, E23.01; 174/258
See application file for complete search history.

(56) References Cited

U.S. PATENT DOCUMENTS

| 5,654,246 | A | * | 8/1997 | Newkirk et al. | ................. 501/80 |
| 6,624,216 | B2 | | 9/2003 | Morganelli et al. | |
| 7,042,074 | B2 | | 5/2006 | Göbl et al. | |
| 2006/0062985 | A1 | * | 3/2006 | Karandikar | ................. 428/292.1 |
| 2009/0146324 | A1 | * | 6/2009 | Auld et al. | .................... 257/791 |

FOREIGN PATENT DOCUMENTS

| DE | 103 55 925 | 6/2005 |
| EP | 0 586 149 | 3/1994 |
| EP | 0 812 013 | 12/1997 |
| EP | 1 956 647 | 8/2008 |
| WO | WO 2004/068550 | 8/2004 |

* cited by examiner

*Primary Examiner* — Edward Wojciechowicz
(74) *Attorney, Agent, or Firm* — The Law Offices of Roger S. Thompson

(57) ABSTRACT

A semiconductor arrangement, in particular a power semiconductor arrangement, in which a semiconductor having a top side provided with contacts is connected to an electrical connection device formed from a film assembly wherein an underfill is provided between the connection device and the top side of the semiconductor. The underfill has a matrix formed from a preceramic polymer.

18 Claims, 1 Drawing Sheet

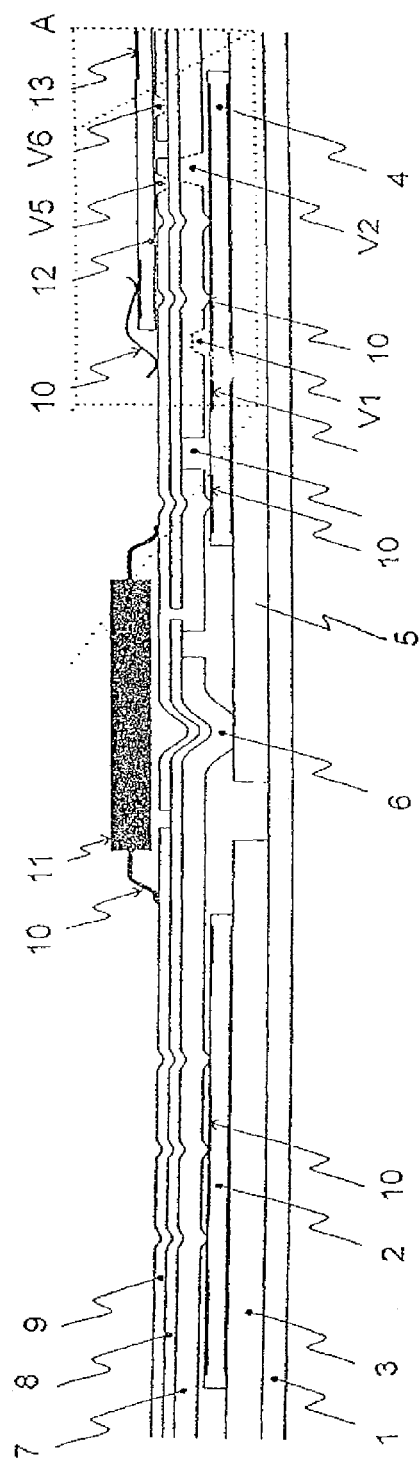
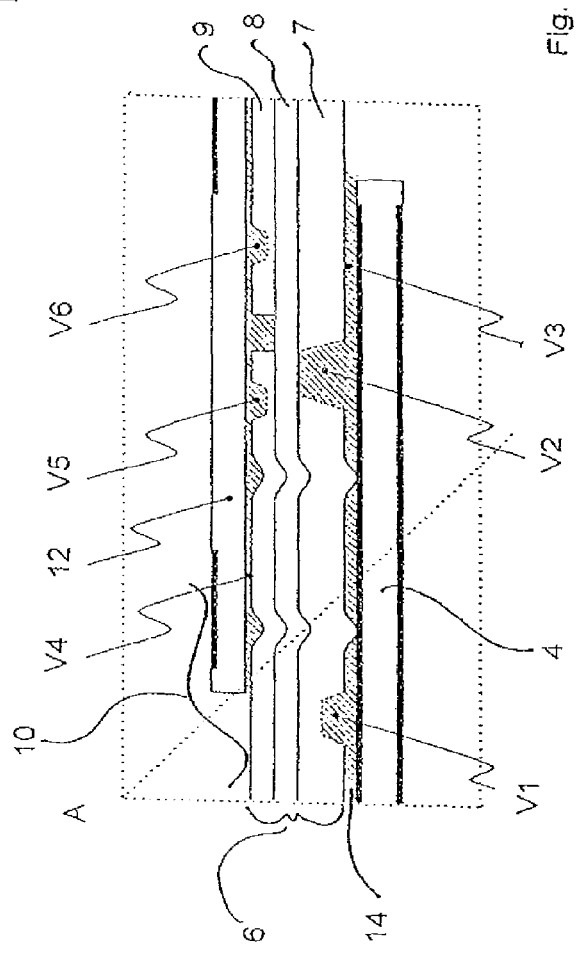

# SEMICONDUCTOR ARRANGEMENT

BACKGROUND OF THE INVENTION

1. Field of the Invention

The invention relates to a semiconductor arrangement, in particular a power semiconductor arrangement.

2. Description of the Related Art

U.S. Pat. No. 6,624,216 discloses a known semiconductor arrangement. In the case of the known semiconductor arrangement, an underfill is formed between a top side of a semiconductor, the top side being provided with contacts, and an electrical connection device formed from a film assembly. The known underfill is formed from an epoxy resin. When the semiconductor used in the arrangement is a power semiconductor, relatively high temperatures occur during operation.

Known epoxy resins used for underfilling have to be stored frozen, usually at a temperature of about −40° C. In practice, the material can be thawed at most three times. Otherwise, the properties of the epoxy resin change, in particular its pot life, which is short under the best of circumstances. For processing purposes, disadvantageously it is firstly necessary to thaw the epoxy resin. That is time-consuming. A further disadvantage of the epoxy resins that have been used hitherto as underfill materials is that they only have a thermal stability in continuous operation of at most 170° C. In addition, the known material has a glass-forming temperature $T_G$ of less than 200° C. Above the glass-forming temperature $T_G$, its coefficient of linear expansion (CTE) changes abruptly. That can lead to undesirable damage or faults during method steps downstream of the production of the underfill, for example during reflow soldering. Finally, the thermal conductivity of the known material is not particularly high, generally in the range of from about 0.25 to about 0.5 W/mK. Consequently, it is not suitable, or is suitable only to a limited extent, in methods for producing a power semiconductor arrangement that involve the release of a relatively large amount of heat during operation.

SUMMARY OF THE INVENTION

It is an object of the invention to eliminate the disadvantages according to the prior art. In particular, it is an object of the invention to provide a semiconductor arrangement whose bond with an electrical connection device has improved durability.

The invention provides for the underfill to have a matrix formed from a preceramic polymer. The underfill proposed is electrically insulating; it has an outstanding thermal stability. It can be set with regard to its coefficient of linear expansion (CTE) such that an outstanding durability of a connection between the semiconductor and the electrical connection device is achieved. Furthermore, the preceramic polymer proposed can be stored at room temperature, and its pot life at room temperature is several months under those circumstances.

For the purposes of the present invention, the term "contacts" as used herein means contact areas provided at the top side, which are separated from one another by an insulation means. Contact areas of this type can be configured in planar, convex or concave fashion. The term "film assembly" as used herein means a flexible laminate composed of at least one metallic film layer and at least one electrically insulating film layer. The at least one electrically insulating film layer can have perforations, such that contact can be made with the metallic film layer through the perforations. In this respect, reference is made for example to U.S. Pat. No. 7,042,074, which describes a film assembly of this type. The disclosure of this document is hereby incorporated by reference.

The term "preceramic polymer" as used herein means a polymer which, as the temperature increases, undergoes transition firstly to a gel-like state and then to a thermosetting state. In the thermosetting state, a preceramic polymer in continuous use generally has a thermal stability of up to about 300° C. If subjected to higher temperatures, ceramic materials can be produced from preceramic polymers. Preceramic polymers within this meaning include, for example, polysilanes, polycarbosilanes and polyorganosilazanes.

According to one preferred embodiment, the preceramic polymer is filled with a filler with a degree of filling of up to approximately 80% by volume, preferably up to only approximately 50% by volume. In particular the flow properties of the preceramic polymer can thus be set.

Preferably, the filler is a powder formed from a ceramic material and having an average grain size in the range of from about 0.5 to about 500 µm. The ceramic materials proposed are substantially inert, i.e., the addition thereof does not lead to undesirable secondary chemical reactions. The average grain size proposed enables the preceramic polymers to be applied using conventional application means, for example needle dispensers, jets or the like.

Preferably, the thermal conductivity λ of the ceramic filler material at room temperature is greater than about 10 W/mK, preferably greater than about 20 W/mK. Depending on the degree of filling, it is thus possible to increase the thermal conductivity of the preceramic polymer filled with the ceramic material to values above about 2 W/mK. The material proposed is thus suitable, in particular, for producing a power semiconductor arrangement that releases a relatively large amount of heat during operation.

The ceramic filler material is preferably selected from the following group: BN, SiC, $Si_3N_4$, AlN, steatite, cordierite. The ceramic materials proposed are distinguished by having a high thermal conductivity.

The preceramic polymer is preferably present in gel-like or thermosetting form. The form desired in each case is determined by the degree of crosslinking of the preceramic polymer. The degree of crosslinking, in turn, can be set for example by supplying thermal energy. The hardness and the stiffness of the preceramic polymer can thus be adapted to the respective requirements. In both forms, the preceramic polymer has a high adhesion to metals, in particular to aluminium or copper, which leads to a particularly firm bond between the electrical connection device and the semiconductor.

It is preferred to select the preceramic polymer from the following group: polysiloxane, polysilazane and polycarbosilane. With the aforementioned materials, it is possible, in particular, to increase the pot life and also to simplify the storage stability. It is possible to achieve a pot life of up to 6 to 9 months when stored at room temperature. The viscosity can be adapted to the requirements of the application by selecting the type of filler, the average grain size thereof and also the degree of filling. One of ordinary skill in the art would be able to select a suitable combination based upon the needs of a particular application without under experimentation.

According to a further embodiment, it is provided that an underside of the semiconductor, the underside being remote from the top side, is connected to a substrate. The semiconductor, in particular a power semiconductor, can be adhesively bonded to the substrate or else fixed by mounting means, for example screws.

Other objects and features of the present invention will become apparent from the following detailed description considered in conjunction with the accompanying drawings.

It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

An exemplary embodiment of the invention is explained in greater detail below with reference to the drawings, in which:

FIG. 1 shows a schematic sectional view through a semiconductor arrangement; and FIG. 2 shows a detailed view of the excerpt designated by dotted lines as "A" in FIG. 1.

DETAILED DESCRIPTION OF THE PRESENTLY PREFERRED EMBODIMENTS

In the case of the semiconductor arrangement shown in the figures, a first power semiconductor 2 is fixed on a substrate 1 with the interposition of a first heat dissipating plate 3 therebetween and a second power semiconductor 4 is fixed thereto with the interposition of a second heat dissipating plate 5 therebetween. First power semiconductor 2 can be, for example, a power diode, and second power semiconductor 4 can be, for example a power transistor.

The reference symbol 6 generally designates an electrical connection device, which is formed from a film assembly. The film assembly 6 comprises a first metal film 7, which is laminated to a second metal film 9 with an electrically insulating film 8 therebetween. First metal film 7 is electrically conductively connected to contacts 10 designated at a top side of first 2 and second semiconductor elements 4. Contacts 10 can be contact areas.

The reference symbol 11 designates a third semiconductor, here a driver component, which is electrically conductively connected to second metal film 9 by means of a contact 10, here embodied in the form of a thin wire.

A fourth power semiconductor 12 has a contact 10 composed of a bonding connection between second metal film 9 and a contact zone 13, which is provided on a further top side of fourth power semiconductor 12.

One of ordinary skill in the art will appreciate that the illustrated power semiconductors may be replaced by other semiconductor components with or without a heat dissipating plate or other components.

As can be seen from FIG. 2, in particular, volumes V1, V2, V3, V4, V5 and V6 between a top side of the power semiconductors 2, 4, 11, 12, said top side facing connection device 6, are filled with an underfill 14. In this case, underfill 14 is formed from a preceramic polymer, preferably a polysiloxane, which is filled with an SiC powder having an average grain size in the range of from about 1 to about 5 µm with a degree of filling of from about 20% to about 35%. In this case, underfill 14 is present in a thermosetting state. This has the advantage that even at operating temperatures in the range of up to 300° C., the underfill proposed hardly changes its properties. On the contrary, underfill 14 proposed contributes to the fact that the heat generated by the power semiconductors 2, 4, 11 and 12 is efficiently dissipated in particular to metal films 7, 9 of the film assembly 6 and is carried away.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An arrangement for connection to a semiconductor, the semiconductor having a top side and contacts, the arrangement comprising:
    an electrical connection device formed from a film assembly, and adapted to be connected to the semiconductor; and
    an underfill having a matrix formed from a preceramic polymer, which is present in gel-like or thermosetting form, said underfill being disposed so that it will be between said electrical connection device and the top side of the semiconductor when the arrangement is assembled with the semiconductor.

2. The arrangement of claim 1, wherein said preceramic polymer is filled with a filler with a degree of filling of up to approximately 80% by volume.

3. The arrangement of claim 2, wherein said degree of filling is up to approximately 50% by volume.

4. The arrangement of claim 2, wherein said filler includes a powder formed from a ceramic filler material, and has an average grain size in the range of from about 0.5 to about 500 µm.

5. The arrangement of claim 4, wherein the thermal conductivity λ of said ceramic filler material at room temperature is greater than approximately 10 W/mK.

6. The arrangement of claim 5, wherein the thermal conductivity λ of said ceramic filler material at room temperature is greater than approximately 20 W/mK.

7. The arrangement of claim 4, wherein said ceramic filler material is selected from the group consisting of: BN, SiC, $Si_3N_4$, AlN, steatite and cordierite.

8. The arrangement of claim 1, wherein said preceramic polymer is selected from the group consisting of: polysiloxane, polysilazane, polycarbosilane.

9. A semiconductor arrangement comprising:
    a semiconductor having a top side provided with contacts;
    an electrical connection device, including a film assembly; and
    an underfill disposed between said electrical connection device and said top side of said semiconductor;
    wherein said underfill includes a matrix formed from a preceramic polymer, which is present in gel-like or thermosetting form.

10. The arrangement of claim 9, wherein said semiconductor has an underside remote from said top side thereof; and
    wherein said underside is adapted to be connected to a substrate.

11. The arrangement of claim 9, wherein said preceramic polymer is filled with a filler with a degree of filling of up to approximately 80% by volume.

12. The arrangement of claim 11, wherein said degree of filling is up to approximately 50% by volume.

13. The arrangement of claim 11, wherein said filler includes a powder formed from a ceramic filler material, and has an average grain size in the range of from about 0.5 to about 500 µm.

14. The arrangement of claim 13, wherein the thermal conductivity λ of said ceramic filler material at room temperature is greater than approximately 10 W/mK.

15. The arrangement of claim 14, wherein the thermal conductivity λ of said ceramic filler material at room temperature is greater than approximately 20 W/mK.

16. The arrangement of claim 13, wherein said ceramic filler material is selected from the group consisting of: BN, SiC, $Si_3N_4$, AlN, steatite and cordierite.

17. The arrangement of claim 9, wherein said preceramic polymer is selected from the group consisting of: polysiloxane, polysilazane, polycarbosilane.

18. The arrangement of claim 9, wherein said semiconductor is a power semiconductor.

\* \* \* \* \*